United States Patent [19]
Ohta et al.

[11] Patent Number: 5,476,690
[45] Date of Patent: Dec. 19, 1995

[54] PROCESS FOR PREPARING PRINTED CIRCUIT BOARD

[75] Inventors: Fumihiko Ohta, Hitachi; Takeshi Nojiri, Iwama; Shinji Tsuchikawa, Hitachi; Akio Nakano, Iwaki; Toshiaki Ishimaru, Hitachi; Hiroshi Yamazaki, Hitachi; Haruo Akahoshi, Hitachi; Mineo Kawamoto, Hitachi; Akio Takahashi, Hitachiota, all of Japan

[73] Assignee: Hitachi Chemical Co., Ltd., Tokyo, Japan

[21] Appl. No.: 253,561

[22] Filed: Jun. 3, 1994

[30] Foreign Application Priority Data

Jun. 3, 1993 [JP] Japan .................................. 5-132261
Dec. 8, 1993 [JP] Japan .................................. 5-306958

[51] Int. Cl.⁶ .................................................. B05D 5/12
[52] U.S. Cl. .......................... 427/510; 427/96; 427/250; 427/259; 427/264; 427/265; 427/270; 427/272; 427/282; 427/385.5; 427/404; 427/407.1; 427/553
[58] Field of Search ........................... 427/487, 553, 427/582, 96, 250, 259, 264, 265, 270, 272, 282, 385.5, 404, 407.1, 510

*Primary Examiner*—Bernard Pianalto
*Attorney, Agent, or Firm*—Antonelli, Terry, Stout & Kraus

[57] ABSTRACT

Disclosed is a process for preparing a printed circuit board, which comprises the steps of:

(1) forming, on the surface of an insulating substrate on a necessitate portion of which electrolessly plated copper is to be precipitated, a layer of a light-sensitive resin composition comprising (a) 40 to 80 parts by weight of a vinyl-polymerized high molecular weight binder having an acid value of 10 to 46 mgKOH/g, (b) 20 to 60 parts by weight of a compound having at least two polymerizable unsaturated double bonds in a molecule, with the total amount of Components (a) and (b) being 100 parts by weight, and (c) a photopolymerization initiator generating free radicals by irradiation of active light in an amount of 0.1 to 10 parts by weight based on 100 parts by weight of Components (a) and (b);

(2) forming a negative pattern of the light-sensitive resin composition on the surface of the substrate by irradiating active light imagewisely and developing with a semi-aqueous developing solution; and (3) forming a circuit pattern by electroless copper plating by using the negative pattern of the light-sensitive resin composition on the surface of the substrate as a plating resist.

13 Claims, 2 Drawing Sheets

(UNIT : mm)

(UNIT : mm)

PROCESS FOR PREPARING PRINTED CIRCUIT BOARD

BACKGROUND OF THE INVENTION

This invention relates to a process for preparing a printed circuit board, more specifically to a process for preparing a printed circuit board, in which a circuit pattern is formed by electroless plating by using a photoresist.

In the prior art, a printed circuit board has been prepared mainly by a subtractive process in which a through-hole is formed by using electroless thin copper plating and electrolytic copper plating in combination and a circuit (wiring) pattern portion is formed by etching. On the other hand, an additive process in which a through-hole and a circuit pattern portion are formed by electroless copper plating has been put to practical use. The additive process is suitable for a fine circuit and a through-hole with a small diameter so that attention has been paid thereto as a process for preparing a high-density printed circuit board to be used in the future.

In the additive process, a resist for electroless copper plating which can stand in an electroless plating solution having high alkalinity (generally pH 11 to 13.5) and high temperature (generally 60° to 80° C.) for a long period of time (generally 4 to 50 hours) is required, and it is difficult to form a fine circuit with each of a line width and a distance between lines being 150 µm by a resist for screen printing so that a photoresist is generally required.

Photoresists for the additive process have been proposed in Japanese Provisional Patent Publications No. 43468/1975, No. 770/1979, No. 100490/1983, No. 199341/1983, No. 12434/1984 and No. 101532/1985. A photoresist having excellent mass productivity by which an electroless copper plating solution is less contaminated has been proposed in Japanese Provisional Patent Publication No. 18692/1988. However, as to all of these proposed photoresists, an organic solvent such as 1,1,1-trichloroethane is used in a developing solution so that there are problems in working environment and a processing cost. Further, use of a halogen-containing organic solvent tends to be limited because of a recent problem of environmental pollution. Thus, there has been demanded a process for preparing a printed circuit board by a photoresist by using a developing solution which ensures good working environment and does not cause a problem of environmental pollution even in the additive process, i.e., a developing solution using no halogen-containing organic solvent.

As a photoresist for electroless plating which can be developed with an alkaline aqueous solution, there has been disclosed an alkaline development type resin composition comprising a combination of a compound obtained by adding hydroxyalkylene (meth)acrylate to a copolymer of maleic anhydride and aromatic hydrocarbon having a vinyl group, and epoxy acrylate having a carboxy group in Japanese Provisional Patent Publication No. 166452/1990.

In Japanese Provisional Patent Publication No. 230154/1990, a photopolymerizable composition comprising a combination of a polymer represented by a compound obtained by adding glycidyl methacrylate to a binary copolymer of styrene and mono-iso-propyl maleate and a polymer represented by a ternary copolymer of benzyl methacrylate, 2-hydroxybutyl methacrylate and methacrylic acid has been disclosed as a resist material for copper plating which can be developed with an alkaline aqueous solution.

However, these proposed photoresists have low tolerance of resistance to electroless copper plating property so that there are problems that pH of a plating solution is heightened and blistering and delamination of the resists are caused when a plating time is long, whereby it is difficult to use the resists in a practical process. Further, in these resists, a large amount of carboxylic acid remains so that the resists absorb water to be blistered in a plating solution having a pH of 12 to 13. There is an essential problem that if plated copper is precipitated in such a state and the resists are shrunk by drying in a drying step, gaps are generated between the resists and the plated copper (see FIG. 1). Existence of these gaps leads to residue of various chemical solutions used in steps subsequent to the plating step and further, a solder resist cannot conform so that electric reliability of a printed circuit board finally obtained is lowered to a great extent.

On the other hand, light-sensitive resin compositions which can be developed with a semi-aqueous solution comprising an alkaline substance and at least one organic solvent have been disclosed in Japanese Patent Publication No. 39895/1972, Japanese Provisional Patent Publications No. 133022/1978, No. 24844/1984, No. 208748/1985 and No. 135936/1988, Japanese Patent Publication No. 28366/1989 and Japanese Provisional Patent Publication No. 220558/1991. However, there has not yet been proposed a process for preparing a printed circuit board in,which a circuit pattern is formed by electroless copper plating by using these light-sensitive resin compositions. As a result of investigation by the present inventors, it has been found that resists prepared by using these light-sensitive resin compositions have problems of poor resistance to electroless copper plating property and contamination of a plating solution.

SUMMARY OF THE INVENTION

An object of the present invention is to provide a process for preparing a printed circuit board in which a circuit pattern is formed by electroless copper plating by using a photoresist which can solve the above problems in the prior art, can be developed with a developing solution which ensures good working environment and has no problem of environmental pollution, and has excellent resistance to plating property and property of less contaminating a plating solution.

That is, the present invention relates to a process for preparing a printed circuit board, which comprises the steps of:

(1) forming, on the surface of an insulating substrate a layer of a light-sensitive resin composition comprising (a) 40 to 80 parts by weight of a vinyl-polymerized type high molecular weight binder having an acid value of 10 to 46 mgKOH/g, (b) 20 to 60 parts by weight of a compound having at least two polymerizable unsaturated double bonds in a molecule, with the total amount of Components (a) and (b) being 100 parts by weight, and (c) a photopolymerization initiator generating free radicals by irradiation of active light in an amount of 0.1 to 10 parts by weight based on 100 parts by weight of Components (a) and (b);

(2) forming a negative pattern in the light-sensitive resin composition on the surface of the substrate by imagewise irradiation of active light and developing with a semi-aqueous developing solution; and (3) forming a circuit pattern by electroless copper plating by using the negative pattern in the light-sensitive resin composition on the surface of the substrate as a plating resist.

DESCRIPTION OF THE PREFERRED EMBODIMENTS

Figure 1:
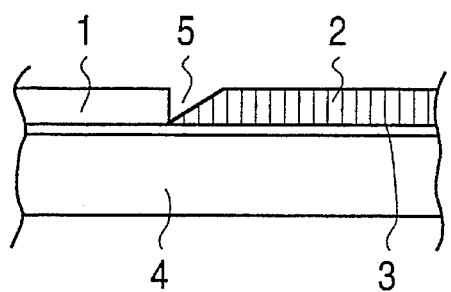
FIG. 1 is a schematic view of a gap between a resist and a plated copper pattern, wherein the reference numeral 1 is a resist, 2 is a plated copper pattern, 3 is an adhesive layer, 4 is a substrate and 5 is a gap.

In the following, the process for preparing a printed circuit board proposed in the present invention is described in detail.

The process for preparing a printed circuit board of the present invention includes a step of forming a layer of a light-sensitive resin composition on the surface of an insulating substrate on a necessitate portion of which electrolessly plated copper is to be precipitated.

As the insulating substrate, there may be used a paper-phenol or glass-epoxy laminated plate, an iron-enameled substrate and a substrate having a metal core such as a substrate obtained by forming an epoxy rein insulating layer on both surfaces of an aluminum plate. These substrates may be dipped in a solution containing a plating catalyst after making through-holes so as to attach the plating catalyst to inner walls of through-holes. As the solution containing a plating catalyst, there may be used a sensitizer HS-101B (trade name) produced by Hitachi Chemical Co., Ltd. For the purpose of obtaining good attachment of a plating catalyst or obtaining good adhesiveness to the substrate on which electrolessly plated copper is precipitated, it is preferred to coat an adhesive layer on the surface of the substrate.

As an adhesive, there may be used an adhesive which has been known as an adhesive for the additive process such as a phenol-modified nitrile rubber type adhesive. In the adhesive, a compound which capable of being a plating catalyst may be contained.

A laminated plate in which a compound which is a catalyst of electroless copper plating such as a palladium compound is internally dispersed is also preferred when electrolessly plated copper is to be precipitated on inner walls of through-holes. As a substrate in which an adhesive layer containing a plating catalyst is formed on the surface of a glass-epoxy laminated plate internally containing a plating catalyst, there may be mentioned a laminated plate ACL-E161 (trade name) produced by Hitachi Chemical Co., Ltd. When such a substrate is used, a step of attaching a plating catalyst is not required. For the purpose of obtaining good attachment of a plating catalyst or obtaining good adhesiveness of electrolessly plated copper precipitated, it is preferred to roughen the surface of the adhesive layer before an electroless plating treatment. As a roughening method, there may be mentioned a method of dipping the substrate in sodium dichromate or an acidic solution containing chromic acid, potassium permanganate or permanganic acid. As conventionally known, a roughening step may be either before a step of forming a layer of a light-sensitive resin composition described below or after a step of forming a resist pattern, so long as it is before a step of electroless copper plating.

The light-sensitive resin composition to be used in the present invention comprises (a) a vinyl-polymerized type high molecular weight binder having an acid value of 10 to 46 mgKOH/g, (b) a compound having at least two polymerizable unsaturated double bonds in a molecule and (c) a photopolymerization initiator generating free radicals by irradiation of active light as essential components.

The vinyl-polymerized type high molecular weight binder having an acid value of 10 to 46 mgKOH/g which is Component (a) is obtained by copolymerizing a vinyl monomer having an acidic polar group such as acrylic acid, methacrylic acid or p-vinylbenzoic acid with other vinyl monomer. As a suitable example of the other vinyl monomer, there may be mentioned methyl methacrylate, butyl methacrylate, ethyl acrylate, styrene, α-methylstyrene, vinyltoluene, benzyl methacrylate, 2-hydroxyethyl methacrylate, 2-hydroxypropyl methacrylate, 2-hydroxyethyl acrylate, glycidyl methacrylate, 2,3-dibromopropyl methacrylate, 3-chloro-2-hydroxypropyl methacrylate, acrylamide, acrylonitrile and methacrylonitrile.

The other vinyl monomers may be used in combination of two or more. For example, the vinyl-polymerized type high molecular weight binder obtained by copolymerizing methacrylic acid as a vinyl monomer having an acidic polar group with a combination of methyl methacrylate and butyl methacrylate as other vinyl monomer is preferred.

In addition, the vinyl-polymerized type high molecular weight binder obtained by copolymerizing a vinyl monomer having the acidic polar group may be obtained by using as the other vinyl monomer a monomer having an amino group represented by the following formula (I):

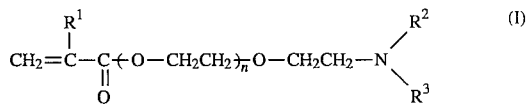

wherein $R^1$ represents a hydrogen atom or a methyl group; $R^2$ and $R^3$ each independently represent an alkyl group having 1 to 12 carbon atoms; and n representing a recurring unit number is an integer of 0 to 3, such as dimethylaminoethyl (meth)acrylate (in the present specification, "(meth)acrylate" means acrylate and methacrylate) and diethylaminoethyl (meth) acrylate. The above vinyl-polymerized type high molecular weight binder has a large effect of improving durability of a resist to a thermal shock test after electroless copper plating is applied. The thermal shock test is to evaluate reliability of connection of a through-hole of a printed circuit board having a circuit formed by electroless copper plating, where it is required that a resist is not blistered nor delaminated.

In the vinyl monomer having an amino group represented by the formula (I), for the reason that resistance to plating property is lowered when a polyethylene glycol structure is long, n is preferably an integer of 0 to 3, particularly preferably 0. In the alkyl group represented by $R^2$ or $R^3$, when a chain length thereof is long, adhesiveness between the substrate and a light-sensitive resin layer is lowered and durability to the thermal shock test described above is lowered due to the problem of steric hindrance, whereby the carbon number is in the range of 1 to 12, preferably 1 to 3, and an alkyl group having one carbon atom is more preferred.

For example, the vinyl-polymerized type high molecular weight binder obtained by copolymerizing methacrylic acid as a vinyl monomer having an acidic polar group with a combination of methyl methacrylate and dimethylaminoethyl methacrylate as other vinyl monomer is also preferred.

The amount of the vinyl monomer having an amino group represented by the formula (I) based on 100 parts by weight of all copolymerizable components is preferably in the range of 0.1 to 30 parts by weight, more preferably 0.5 to 10 parts by weight, particularly preferably 1 to 5 parts by weight based on 100 parts by weight of all copolymerizable components from the point of improving durability to a thermal shock test and adhesiveness between the substrate and a resist.

Here, the copolymerization rate of the vinyl monomer having an acidic polar group such as acrylic acid, methacrylic acid and p-vinylbenzoic acid is limited to such a rate that the acid value of the vinyl-polymerized type high molecular weight binder (a) obtained by copolymerization is in the range of 10 to 46 mgKOH/g. If the acid value of the vinyl-polymerized type high molecular weight binder (a) is less than 10 mgKOH/g, developability with a semi-aqueous developing solution is lowered, while if it exceeds 46 mgKOH/g, a gap is generated between a resist and plated copper to lower resistance to electroless copper plating property. In order to obtain better developability and highly reliable resistance to electroless copper plating property, the acid value of the vinyl-polymerized type high molecular weight binder (a) is preferably in the range of 20 to 40 mgKOH/g.

When the vinyl monomer having an amino group represented by the formula (I) is used, the vinyl monomer having an acidic polar group is preferably formulated in an amount of 1 to 7 parts by weight, more preferably 2 to 6 parts by weight based on 100 parts by weight of all monomers, and the other vinyl monomer other than the vinyl monomer having an amino group represented by the formula (I) is preferably formulated in an amount of 63 to 98.9 parts by weight, more preferably 88 to 98 parts by weight based on 100 parts by weight of all monomers. When the vinyl monomer having an amino group represented by the formula (I) is not used, the vinyl monomer having an acidic polar group is preferably formulated in an amount of 1 to 7 parts by weight, more preferably 2 to 6 parts by weight based on 100 parts by weight of all monomers, and the other vinyl monomer is preferably formulated in an amount of 93 to 99 parts by weight, more preferably 94 to 98 parts by weight based on 100 parts by weight of all monomers.

The weight average molecular weight of the vinyl-polymerized type high molecular weight binder (a) is preferably in the range of 20,000 to 200,000. If the weight average molecular weight is less than 20,000, flexibility of a resist is lowered so that a resist tends to be broken, while if it exceeds 200,000, developability tends to be lowered.

As an example of the compound having at least two polymerizable unsaturated double bonds in a molecule which is Component (b), there may be mentioned (i) a (meth)acrylate of a polyvalent alcohol such as diethylene glycol dimethacrylate, tetraethylene glycol diacrylate, hexapropylene glycol diacrylate, trimethylolpropane triacrylate, pentaerythritol triacrylate, 1,6-hexanediol diacrylate, dipentaerythritol pentaacrylate and trimethylolpropane trimethacrylate; (ii) a (meth)acrylate having a benzene ring in a molecule such as an epoxy acrylate (e.g. an acrylic acid or methacrylic acid adduct of 2,2-bis(4-methacryloxyethoxyphenyl)propane, 2,2-bis(4-acryloxyethoxyphenyl)propane, bisphenol A or an epichlorohydrin type epoxy resin) and a low molecular weight unsaturated polyester (e.g. a condensate of phthalic anhydride-neopentyl glycol-acrylic acid at a molar ratio of 1:2:2); (iii) an acrylic acid or methacrylic acid adduct of trimethylolpropane triglycidyl ether; and (iv) a urethane acrylate compound or urethane methacrylate compound obtained by reacting trimethylhexamethylene diisocyanate with an acrylic acid monoester or methacrylic acid monoester of a divalent alcohol.

These compounds may be used in combination of two or more. Among the above compounds, BPE-10 (trade name of bisphenol A polyoxyethylene dimethacrylate produced by Shinnakamura Kagaku Kogyo Co.), BPE-4 (trade name of bisphenol A polyoxyethylene dimethacrylate produced by Shinnakamura Kagaku Kogyo Co.) and UA-5 (urethane acrylate obtained by synthesizing from 2 mole of trimethylhexamethylene diisocyanate, 2 mole of 2-hydroxyethyl acrylate and 1 mole of cyclohexanedimethanol) are preferred. These three compounds may be used in combination of two or more. In particular, BPE-10 and a combination of BPE-4 and UA-5 are preferred.

As the photopolymerization initiator which is Component (c), there may be used a photopolymerization initiator which has conventionally been known, for example, benzophenones such as benzophenone, p,p-dimethylaminobenzophenone p,p-diethylaminobenzophenone and p,p-dichlorobenzophenone, a mixture of these, anthraquinones such as 2-ethylanthraquinone and t-butylanthraquinone, 2-chlorothioxanthone, benzoin isopropyl ether, benzoin ethyl ether, benzil and a 2,4,5-triarylimidazole dimer.

Among the compounds, I-651 (trade name of benzil dimethyl ketal produced by Ciba Geigy AG) is preferred.

In the light-sensitive resin composition of the present invention, 40 to 80 parts by weight of the vinyl-polymerized type high molecular weight binder (a) having an acid value of 10 to 46 mgKOH/g and 20 to 60 parts by weight of the compound (b) having at least two polymerizable unsaturated double bonds in a molecule are required to be used so that the total amount of Components (a) and (b) is 100 parts by weight, and the photopolymerization initiator (c) is required to be used in an amount of 0.1 to 10 parts by weight based on 100 parts by weight of Components (a) and (b). If the amount of Component (a) used is too large, sensitivity is lowered, while if it is too small, handling property is lowered due to sticking of a light-sensitive layer. If the amount of Component (c) exceeds 10 parts by weight, no particular advantage can be obtained, while if it is less than 0.1 part by weight, sensitivity is lowered.

To the light-sensitive resin composition to be used in the present invention, a dye, a plasticizer, a pigment, a flame retardant and a stabilizer may be added, if necessary. Further, an adhesiveness-imparting agent may be also added.

The process for preparing a printed circuit board of the present invention necessarily includes a step of forming a layer of the light-sensitive resin composition described in detail above on the surface of the insulating substrate on a necessitate portion of which electrolessly plated copper is to be precipitated. The step of forming a layer of the light-sensitive resin composition on the surface of the insulating substrate on a necessitate portion of which electrolessly plated copper is to be precipitated can be carried out according to a conventional manner. The above step can be carried out by, for example, uniformly dissolving or dispersing the light-sensitive resin composition in a solvent such as methyl ethyl ketone, toluene and methylene chloride, coating the resulting solution or dispersion on the surface of the insulating substrate on which electrolessly plated copper is to be precipitated, according to a dip coating method or a flow coating method, and drying the solvent.

The layer of the light-sensitive resin composition can be also formed on the surface of the substrate without coating a solution of the light-sensitive resin composition directly on the substrate, i.e., by coating a solution of the light-sensitive resin composition on a base film by a known method such as a knife coating method and a roll coating method, drying the coated solution to prepare a light-sensitive element having a layer of the light-sensitive resin composition on the base film and then laminating the light-sensitive element on the surface of a light-sensitive substrate on which electrolessly plated copper is to be precipitated by heating and pressurizing by a known method. As the base film, there may be used a known film such as a polyester film, a polypropylene film, a polyimide film and a polystyrene film. The process using the light-sensitive element is preferred in the points that a coated film thickness can be easily made uniform and an adhesive having low solvent resistance can be used. The layer thickness of the light-sensitive resin composition to be formed is not particularly limited, but it is preferably 5 to 150 μm from the points of uniformity of a coated film and resolution of a resist pattern formed by exposure and development.

The process for preparing a printed circuit board of the present invention necessarily includes a step of forming a negative pattern of the light-sensitive resin composition on the surface of the substrate by imagewise irradiation of active light and development. The imagewise irradiation of active light can be carried out by imagewise exposure through a negative mask by using a light source such as an ultra-high pressure mercury lamp and a high pressure mercury lamp. Further, said irradiation can be also carried out by scanning laser beams concentrated on an extremely small diameter imagewisely.

As the developing solution to be used in the present invention, the so-called semi-aqueous developing solution comprising an alkaline substance and at least one organic solvent is used. As the alkaline substance, there may be mentioned an alkali metal hydroxide such as sodium hydroxide, potassium hydroxide and ammonium hydroxide, a carbonate such as sodium carbonate and potassium carbonate, a phosphate such as trisodium phosphate, a borate such as borax, sodium metasilicate, an organic amine such as ethanolamine, ethylenediamine, diethylenetriamine, 2-amino-2-hydroxymethyl-1,3-propanediol, 2-amino-2-methyl-1,3-propanediol and 1,3-diaminopropanol-2, morpholine and other alkaline substances which have been commonly used.

It is desired to maintain the pH of the developing solution as small as possible within the range in which a resist can be developed sufficiently. The pH is preferably in the range of 8 to 12, more preferably in the range of 9 to 10.

As the organic solvent, there may be mentioned, for example, triacetone alcohol, acetone, ethyl acetate, alkoxyethanol having an alkoxy group with 1 to 4 carbon atoms, ethyl alcohol, isopropyl alcohol, butyl alcohol and diethylene glycol monomethyl ether. These organic solvents may be used in combination of two or more. The concentration of the organic solvent is generally in the range of 2 to 50% by volume. Further, the temperature can be adjusted depending on developability. To the developing solution, small amounts of a surfactant and an anti-foaming agent may be added. Development can be carried out by dipping the substrate in the developing solution or spraying the developing solution to the substrate.

The negative pattern of the light-sensitive resin composition thus formed exhibits excellent alkali resistance so that it can be used as Such as a resist for electroless copper plating. After development, exposure of active light and/or a heating treatment at 80° to 200° C. may be further carried out to obtain a cured film having excellent soldering heat resistance, thermal shock resistance and solvent resistance. After development, either of the exposure of active light or the heating treatment may be carried out firstly, and the exposure of active light and the heating treatment may be divided into several steps. The heating treatment can serve for a heating treatment for curing the adhesive. The cured film of the light-sensitive resin composition thus formed has excellent characteristics so that it can be used as a permanent mask after electroless copper plating without delamination, whereby the process can be simplified. The cured film may be also delaminated and removed after electroless copper plating. When the cured film is delaminated and removed after electroless copper plating, exposure of active light after development is not required.

The process for preparing a printed circuit board of the present invention necessarily includes a step of forming a circuit pattern by electroless copper plating by using the negative pattern of the light-sensitive resin composition obtained as described above as a plating resist. As a electroless plating solution, there may be used a plating solution containing a copper salt, a complexing agent, a reducing agent and a pH adjusting agent.

As the copper salt, there may be used, for example, copper sulfate, copper nitrate and cupric chloride. As the complexing agent, there may be used, for example, ethylenediaminetetraacetic acid, N,N,N',N'-tetrakis-2-hydroxypropylethylenediamine and Rochelle salt. As the reducing agent, formalin is preferred. As the pH-adjusting agent, there may be generally used an alkali hydroxide such as sodium hydroxide and potassium hydroxide. For the purpose of increasing stability of a plating bath or improving characteristics of a copper metal precipitated, various additives may be added. Conditions of a plating bath are preferably a copper concentration of 5 to 15 g/liter, a pH of 11 to 13 and a bath temperature of 60° to 80° C. from the points of stability of a plating bath and characteristics of a copper metal precipitated.

In electroless copper plating, a plating catalyst may be attached and/or activated, if necessary. After forming a copper pattern, the whole or desired portion of the copper pattern may be coated with solder by a soldering leveler or plated with gold or tin for the purpose of protecting the copper surface from oxidation or lowering contact resistance when the copper surface is an electric contacting portion. On a necessary portion of the substrate of which the copper surface is or is not covered with a metal such as solder, gold and tin, a solder mask can be formed. The solder mask can be also used as a resist for covering only a desired portion of the copper pattern with solder. The solder mask can be formed by printing an epoxy resin type ink by screen printing and curing the ink, but a solder mask with high precision can be also formed by using the light-sensitive resin composition to be used in the present invention, according to a photographic process.

The printed circuit board thus prepared can be applied to various uses by a known method, for example, it can be used by soldering an electric part. Also, the printed circuit board after electroless copper plating as such or said board from which the resist is delaminated may be used as an inner layer plate of a multi-layer printed circuit board.

EXAMPLES

The present invention is in detail by referring to Examples. In Examples and Comparative examples, "part" means "part by weight" and "%" means "% by weight".

Synthetic Example 1

Materials A shown in Table 1 were charged into a reactor having a volume of 500 ml equipped with a thermometer, a stirring device, a cooling tube, a gas-introducing tube and a funnel, in which heating and cooling could be carried out, and heated to 78° C. under a nitrogen gas atmosphere. While maintaining a reaction temperature at 78°±2° C., Materials B shown in Table 1 were uniformly added dropwise over 3 hours. After the dropwise addition of Materials B, the mixture was stirred at 78° C. for about 6 hours and then cooled to lower than 60° C. After Materials C shown in Table 1 is added to the mixture, the resulting mixture was stirred for 15 minutes and then cooled to room temperature to obtain Solution (a-1) containing 36.9% of a vinyl-polymerized type high molecular weight binder having an acid value of 19.6 mgKOH/g (weight average molecular weight: 70,000).

TABLE 1

| | Material | Amount formulated |
|---|---|---|
| A | Ethylene glycol monomethyl ether | 93 parts |
| | Toluene | 68 parts |
| B | Methacrylic acid | 3 parts |
| | Methyl methacrylate | 87 parts |
| | Butyl methacrylate | 10 parts |
| | 2,2'-Azobis(isobutyronitrile) | 0.4 part |
| C | Ethylene glycol monomethyl ether | 10 parts |
| | Hydroquinone | 0.01 part |

Synthetic Example 2

Procedures were carried out in the same manner as in Synthetic example 1 except for changing Materials B as shown in Table 2 to obtain Solution (a-2) containing 36.9% of a vinyl-polymerized type high molecular weight binder having an acid value of 26.1 mgKOH/g (weight average molecular weight: 70,000).

TABLE 2

| | Material | Amount formulated |
|---|---|---|
| B | Methacrylic acid | 4 parts |
| | Methyl methacrylate | 86 parts |
| | Butyl methacrylate | 10 parts |
| | 2,2'-Azobis(isobutyronitrile) | 0.4 part |

Synthetic Example 3

Procedures were carried out in the same manner as in Synthetic example 1 except for changing Materials B as shown in Table 3 to obtain Solution (a-3) containing 36.9% of a vinyl-polymerized type high molecular weight binder having an acid value of 32.6 mgKOH/g (weight average molecular weight: 70,000).

TABLE 3

| | Material | Amount formulated |
|---|---|---|
| B | Methacrylic acid | 5 parts |
| | Methyl methacrylate | 85 parts |
| | Butyl methacrylate | 10 parts |
| | 2,2'-Azobis(isobutyronitrile) | 0.4 part |

Synthetic Example 4

Procedures were carried out in the same manner as in Synthetic example 1 except for changing Materials B as shown in Table 4 to obtain Solution (a-4) containing 36.9% of a vinyl-polymerized type high molecular weight binder having an acid value of 39.1 mgKOH/g (weight average molecular weight: 70,000).

TABLE 4

| | Material | Amount formulated |
|---|---|---|
| B | Methacrylic acid | 6 parts |
| | Methyl methacrylate | 84 parts |
| | Butyl methacrylate | 10 parts |
| | 2,2'-Azobis(isobutyronitrile) | 0.4 part |

Synthetic Example 5

Procedures were carried out in the same manner as in Synthetic example 1 except for changing Materials B as shown in Table 5 to obtain Solutions (a-5) to (a-10) containing 36.9% of a vinyl-polymerized type high molecular weight binder containing an amino group-containing monomer as a copolymerizable component and having an acid value of 26.1 mgKOH/g (weight average molecular weight: 70,000), respectively.

TABLE 5

| | Amount formulated | | | | | |
|---|---|---|---|---|---|---|
| Material | a-5 | a-6 | a-7 | a-8 | a-9 | a-10 |
| Methacrylic acid | 4 parts | 4 parts | 4 parts | 4 parts | 4 parts | 4 parts |
| Methyl methacrylate | 95.9 parts | 95 parts | 93 parts | 91 parts | 86 parts | 66 parts |
| Dimethylaminoethyl methacrylate | 0.1 part | 1 part | 3 parts | 5 parts | 10 parts | 30 parts |
| 2,2'-Azobis(isobutyronitrile) | 0.4 part | 0.4 part | 0.4 part | 10.4 part | 0.4 part | 0.4 part |

Comparative Synthetic Example 1

Procedures were carried out in the same manner as in Synthetic example 1 except for changing Materials B as shown in Table 6 to obtain Solution (a-11) containing 36.9% of a vinyl-polymerized type high molecular weight binder having an acid value of 52 mgKOH/g (weight average molecular weight: 70,000).

TABLE 6

| | Material | Amount formulated |
|---|---|---|
| B | Methacrylic acid | 8 parts |
| | Methyl methacrylate | 82 parts |
| | Butyl methacrylate | 10 parts |
| | 2,2'-Azobis(isobutyronitrile) | 0.4 part |

Comparative Synthetic Example 2

Procedures were carried out in the same manner as in Synthetic example 1 except for changing Materials B as shown in Table 7 to obtain Solution (a-12) containing 36.9% of a vinyl-polymerized type high molecular weight binder having an acid value of 78.2 mgKOH/g (weight average molecular weight: 70,000).

TABLE 7

| | Material | Amount formulated |
|---|---|---|
| B | Methacrylic acid | 12 parts |
| | Methyl methacrylate | 78 parts |
| | Butyl methacrylate | 10 parts |
| | 2,2'-Azobis(isobutyronitrile) | 0.4 part |

Example 1

(a) Preparation of light-sensitive element

Figure 2:
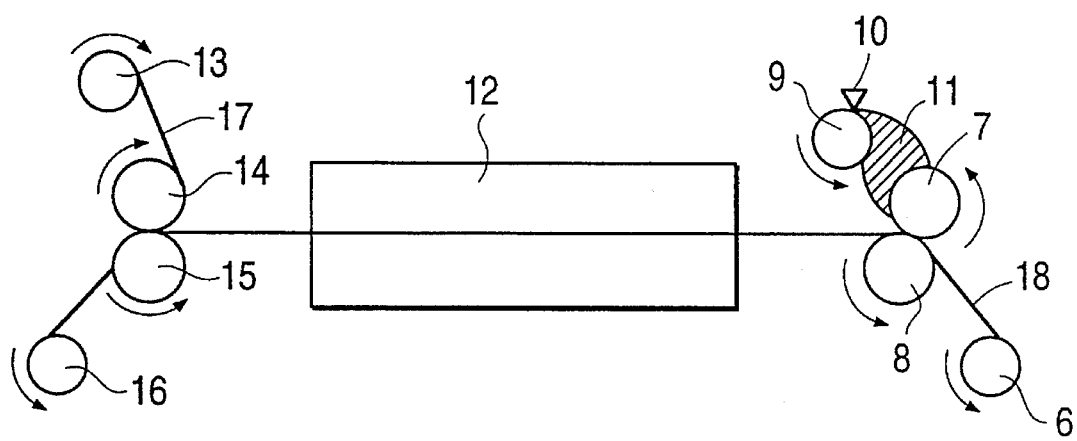
FIG. 2 is a schematic view of a device for preparing a light-sensitive element used in Examples described below.

By using a device shown in FIG. 2, a solution of a light-sensitive resin composition 11 comprising materials shown in Table 8 was uniformly coated on a polyethylene terephthalate film 18 having a thickness of 25 μm and dried at 80° to 100° C. for about 10 minutes by using a circulating hot air dryer 12. The layer of the light-sensitive resin composition after drying had a thickness of about 35 μm. On the layer of the light-sensitive resin composition, a polyethylene film 17 having a thickness of about 25 μm was pasted as a cover film as shown in FIG. 2.

TABLE 8

| Material | Amount formulated |
|---|---|
| Solution (a-1) of vinyl-polymerized type high molecular weight binder obtained in Synthetic example 1 (55 parts as vinyl polymerized type high molecular weight binder) | 149 parts |
| BPE-4 (trade name of bisphenol A polyoxyethylene dimethacrylate produced by Shinnakamura Kagaku Kogyo Co.) | 45 parts |
| I-651 (trade name of benzil dimethyl ketal produced by Ciba Geigy AG) | 6 parts |
| Victoria Pure Blue (dye) | 0.04 part |
| Methyl ethyl ketone (solvent) | 10 parts |

In FIG. 2, the reference numeral 6 is a polyethylene terephthalate film-drawing out roll, 7, 8 and 9 are rolls, 10 is a knife, 13 is a polyethylene film-drawing out roll, 14 and 15 are rolls and 16 is a light-sensitive element-taking up roll.

(b) Preparation of printed circuit board

On a substrate ACL-E-161 (trade name, a substrate obtained by coating a phenol-modified nitrile rubber type adhesive containing a plating catalyst on both surfaces of a glass-epoxy laminated plate containing a palladium type plating catalyst so as to have a thickness of about 30 μm) for the additive process produced by Hitachi Chemical Co., Ltd., through-holes having a diameter of 1.0 mm were made at intervals of 2.54 mm by using an NC drill to prepare a test substrate. After the test substrate was polished with a nylon brush, washed with water and dried by heating at 80° C. for 10 minutes, the light-sensitive element obtained in the above (a) was laminated on the test substrate by using a laminate A-500 Model (trade name) manufactured by Akebono Sangyo Co. A negative mask for testing shown in FIG. 3 was adhered to both surfaces of the test substrate, and exposure of 210 mJ/cm$^2$ was carried out by using an exposer HMW-590 Model (trade name) manufactured by Orc Seisakusho Co. After the test substrate was left to stand at normal temperature for 20 minutes, the polyester film which was a support film was delaminated and the test substrate was subjected to spray development at 40° C. for 30 seconds with a semi-aqueous developing solution prepared by using 8 g of borax ($Na_2B_4O_7 \cdot 10H_2O$), 200 ml of diethylene glycol mono-n-butyl ether and 800 ml of water at this ratio. After development, the test substrate was dried at 80° C. for 10 minutes and then subjected to irradiation with UV rays of 2 J/cm$^2$ by using a UV ray irradiator manufactured by Toshiba Denzai Co.

The test substrate on which a resist image was formed as described above was dipped in a solution of 20 g of sodium dichromate dissolved in 1 liter of 42% borofluoric acid at 40° C. for 15 minutes to roughen the exposed portion of the adhesive layer. The test substrate was washed with water, dipped in 3N hydrochloric acid for 5 minutes and washed with water. The test substrate was dipped in an electroless copper plating solution containing 15 g/liter of $CuSO_4 \cdot 5H_2O$, 30 g/liter of ethylenediaminetetraacetic acid and 10 ml/liter of a 37% formaldehyde (HCHO) aqueous solution, which was adjusted to pH 12.5 with NaOH, at 70° C. for 15 hours, washed with water and then dried at 80° C. for 10 minutes.

No crack was made on the resist, and the resist was not blistered nor delaminated from the test substrate. On a portion where there was no resist on the test substrate, a copper pattern having a thickness of about 30 μm was formed according to the negative mask pattern. Also on inner walls of the through-holes, an electroless copper plating film having a thickness of about 30 μm was formed. Further, there was no gap between the resist and the copper pattern.

The printed circuit board thus prepared was coated with a rosin type flax A-226 (trade name) produced by Tamura Kaken Co., dipped in a soldering bath at 260° C. for 10 seconds and then dipped in Tri-Clene (trade name) produced by Toagosei Chemical Industry Co., Ltd. at 25° C. for 20 seconds to remove the flax. No crack was made on the resist, and neither blistering nor delamination of the resist from the test substrate was observed. Thus, it was found that soldering heat resistance was excellent. Further, as MIL-STD-202E107D conditions B (at −65° C. for 30 minutes ↔ at normal temperature within 5 minutes ↔ at 125° C. for 30 minutes), a thermal shock test of 50 cycles was conducted. No crack was made on the resist, and neither blistering nor delamination of the resist from the test substrate was observed. Thus, it was found that reliability for a long period of time was excellent.

Example 2

(a) Preparation of light-sensitive element

Procedures were carried Out in the same manner as in Example 1 (a) except for using a solution of a light-sensitive resin composition comprising materials shown in Table 9 to obtain a light-sensitive element having a layer thickness of the light-sensitive resin composition being about 35 μm.

TABLE 9

| Material | Amount formulated |
| --- | --- |
| Solution (a-2) of vinyl-polymerized type high molecular weight binder obtained in Synthetic example 2 (55 parts as vinyl polymerized type high molecular weight binder) | 149 parts |
| BPE-4 | 45 parts |
| I-651 | 6 parts |
| Victoria Pure Blue | 0.04 part |
| Methyl ethyl ketone | 10 parts |

(b) Preparation of printed circuit board

In the same manner as in Example 1 (b) except for using the light-sensitive element obtained in the above (a), an electroless copper plating pattern was formed on a test substrate on which a resist image was formed.

No crack was made on the resist, and the resist was not blistered nor delaminated from the test substrate. On a portion where there was no resist on the test substrate, a copper pattern having a thickness of about 30 μm was formed according to the negative mask pattern. Also on inner walls of the through-holes, an electroless copper plating film having a thickness of about 30 μm was formed. Further, there was no gap between the resist and the copper pattern.

The printed circuit board thus prepared was coated with a rosin type flax A-226 (trade name) produced by Tamura Kaken Co., dipped in a soldering bath at 260° C. for 10 seconds and then dipped in Tri-Clene (trade name) produced by Toagosei Chemical Industry Co., Ltd. at 25° C. for 20 seconds to remove the flax. No crack was made on the resist, and neither blistering nor delamination of the resist from the test substrate was observed. Thus, it was found that soldering heat resistance was excellent. Further, as MIL-STD-202E107D conditions B (at −65° C. for 30 minutes ↔ at normal temperature within 5 minutes ↔ at 125° C. for 30 minutes), a thermal shock test of 50 cycles was conducted. No crack was made on the resist, and neither blistering nor delamination of the resist from the test substrate was observed. Thus, it was found that reliability for a long period of time was excellent.

Example 3

(a) Preparation of light-sensitive element

Procedures were carried out in the same manner as in Example 1 (a) except for using a solution of a light-sensitive resin composition comprising materials shown in Table 10 to obtain a light-sensitive element having a layer thickness of the light-sensitive resin composition being about 35 μm.

TABLE 10

| Material | Amount formulated |
| --- | --- |
| Solution (a-3) of vinyl-polymerized type high molecular weight binder obtained in Synthetic example 3 (55 parts as vinyl polymerized type high molecular weight binder) | 149 parts |
| BPE-4 | 45 parts |
| I-651 | 6 parts |
| Victoria Pure Blue | 0.04 part |
| Methyl ethyl ketone | 10 part |

(b) Preparation of printed circuit board

In the same manner as in Example 1 (b) except for using the light-sensitive element obtained in the above (a), an electroless copper plating pattern was formed on a test substrate on which a resist image was formed.

No crack was made on the resist, and the resist was not blistered nor delaminated from the test substrate. On a portion where there was no resist on the test substrate, a copper pattern having a thickness of about 30 μm was formed according to the negative mask pattern. Also on inner walls of the through-holes, an electroless copper plating film having a thickness of about 30 μm was formed. Further, there was no gap between the resist and the copper pattern.

The printed circuit board thus prepared was coated with a rosin type flax A-226 (trade name) produced by Tamura Kaken Co., dipped in a soldering bath at 260° C. for 10 seconds and then dipped in Tri-Clene (trade name) produced by Toagosei Chemical Industry Co., Ltd. at 25° C. for 20 seconds to remove the flax. No crack was made on the resist, and neither blistering nor delamination of the resist from the test substrat was observed. Thus, it was found that soldering heat resistance was excellent. Further, as MIL-STD-202E107D conditions B (at −65° C. for 30 minutes ↔ at normal temperature within 5 minutes ↔ at 125° C. for 30 minutes), a thermal shock test of 50 cycles was conducted. No crack was made on the resist, and neither blistering nor delamination of the resist from the test substrate was observed. Thus, it was found that reliability for a long period of time was excellent.

Example 4

(a) Preparation of light-sensitive element

Procedures were carried out in the same manner as in Example 1 (a) except for using a solution of a light-sensitive resin composition comprising materials shown in Table 11 to obtain a light-sensitive element having a layer thickness of the light-sensitive resin composition being about 35 μm.

TABLE 11

| Material | Amount formulated |
| --- | --- |
| Solution (a-4) of vinyl-polymerized type high molecular weight binder obtained in Synthetic example 4 (55 parts as vinyl polymerized type high molecular weight binder) | 149 parts |
| BPE-4 | 45 parts |
| I-651 | 6 parts |
| Victoria Pure Blue | 0.04 part |
| Methyl ethyl ketone | 10 parts |

(b) Preparation of printed circuit board

In the same manner as in Example 1 (b) except for using the light-sensitive element obtained in the above (a), an electroless copper plating pattern was formed on a test substrate on which a resist image was formed.

No crack was made on the resist, and the resist was not blistered nor delaminate from the test substrate. On a portion where there was no resist on the test substrate, a copper pattern having a thickness of about 30 μm was formed according to the negative mask pattern. Also on inner walls of the through-holes, an electroless copper plating film having a thickness of about 30 μm was formed. Further, there was no gap between the resist and the copper pattern.

The printed circuit board thus prepared was coated with a rosin type flax A-226 (trade name) produced by Tamura Kaken Co., dipped in a soldering bath at 260° C. for 10 seconds and then dipped in Tri-Clene (trade name) produced by Toagosei Chemical Industry Co., Ltd. at 25° C. for 20 seconds to remove the flax. No crack was made on the resist, and neither blistering nor delamination of the resist from the test substrat was observed. Thus, it was found that soldering heat resistance was excellent. Further, as MIL-STD-202E107D conditions B (at −65° C. for 30 minutes ↔ at normal temperature within 5 minutes ↔ at 125° C. for 30 minutes), a thermal shock test of 50 cycles was conducted. No crack was made on the resist, and neither blistering nor delamination of the resist from the test substrate was observed. Thus, it was found that reliability for a long period of time was excellent.

Example 5

(a) Preparation of light-sensitive element

Procedures were carried out in the same manner as in Example 1 (a) except for using a solution of a light-sensitive resin composition comprising materials shown in Table 12 to obtain a light-sensitive element having a layer thickness of the light-sensitive resin composition being about 35 μm.

TABLE 12

| Material | Amount formulated |
|---|---|
| Solution (a-2) of vinyl-polymerized type high molecular weight binder obtained in Synthetic example 2 (55 parts as vinyl polymerized type high molecular weight binder) | 149 parts |
| BPE-10 (trade name of bisphenol A polyoxyethylene dimethacrylate produced by Shinnakamura Kagaku Kogyo Co.) | 25 parts |
| UA-5 (urethane acrylate obtained by synthesizing from 2 mole of trimethylhexamethylene diisocyanate, 2 mole of 2-hydroxyethyl acrylate and 1 mole of cyclohexanedimethanol) | 20 parts |
| I-651 | 6 parts |
| Victoria Pure Blue | 0.04 part |
| Methyl ethyl ketone | 10 parts |

(b) Preparation of printed circuit board

On a substrate ACL-E-161 (trade name) for the additive process produced by Hitachi Chemical Co., Ltd., through-holes having a diameter of 0.8 mm were made at intervals of 2.54 mm by using a NC drill to prepare a test substrate. The test substrate was polished with a Scotch-Brite (trade name) produced by Sumitomo 3M Co., Ltd., washed with water and then dipped in a roughening solution of 20 g of sodium dichromate dissolved in 1 liter of 42% borofluoric acid at 40° C. for 5 minutes to roughen the surface of the adhesive layer, followed by washing with water and drying at 80° C. for 10 minutes.

The light-sensitive element obtained in the above (a) was laminated on both surfaces of the test substrate by using a laminate A-500 Model (trade name) manufactured by Akebono Sangyo Co. Then, a negative mask for testing shown in FIG. 3 was adhered to both surfaces of the test substrate, and exposure of 210 mJ/cm$^2$ was carried out by using an exposer HMW-590 Model (trade name) manufactured by Orc Seisakusho Co. After the test substrate was left to stand at normal temperature for 20 minutes, the support film was delaminated and then the test substrate was subjected to spray development at 40° C. for 30 seconds with a semi-aqueous developing solution prepared by using 8 g of borax (Na$_2$B$_4$O$_7$.10H$_2$O), 200 ml of diethylene glycol mono-n-butyl ether and 800 ml of water at this ratio. After development, the test substrate was dried at 80° C. for 10 minutes and then subjected to irradiation of UV rays of 2 J/cm$^2$ by using a UV ray irradiator manufactured by Toshiba Denzai Co. Then, the test substrate was dipped in about 3N hydrochloric acid for 5 minutes and washed with water. The test substrate was dipped in an electroless copper plating solution containing 10 g/liter of CuSO$_4$.5H$_2$O, 40 g/liter of sodium ethylenediaminetetraacetate and 5 ml/liter of a 37% HCHO aqueous solution, which was adjusted to pH 12.0 with NaOH, at 70° C. for 40 hours, washed with water and then dried at 80° C. for 10 minutes. No crack was made on the resist, and the resist was not blistered nor delaminated from the test substrate. A copper pattern having high precision was formed according to the negative mask pattern. Further, there was no gap between the resist and the copper pattern.

The printed circuit board thus prepared was coated with a rosin type flax A-226 (trade name) produced by Tamura Kaken Co., dipped in a soldering bath at 260° C. for 10 seconds and then dipped in Tri-Clene (trade name) produced by Toagosei Chemical Industry Co., Ltd. at 25° C. for 20 seconds to remove the flax. No crack was made on the resist, and neither blistering nor delamination of the resist from the test substrat was observed. Thus, it was found that soldering heat resistance was excellent. Further, as MIL-STD-202E107D conditions B (at −65° C. for 30 minutes ↔ at normal temperature within 5 minutes ↔ at 125° C. for 30 minutes), a thermal shock test of 50 cycles was conducted. No crack was made on the resist, and neither blistering nor delamination of the resist from the test substrate was observed. Thus, it was found that reliability for a long period of time was excellent.

Example 6

(a) Preparation of light-sensitive element

Procedures were carried out in the same manner as in Example 1 (a) except for using a solution of a light-sensitive resin composition comprising materials shown in Table 13 to obtain a light-sensitive element having a layer thickness of the light-sensitive resin composition being about 35 μm.

TABLE 13

| Material | Amount formulated |
|---|---|
| Solution (a-3) of vinyl-polymerized type high molecular weight binder obtained in Synthetic example 3 (52 parts as vinyl polymerized type high molecular weight binder) | 141 parts |

TABLE 13-continued

| Material | Amount formulated |
|---|---|
| BPE-4 | 18 parts |
| BPE-10 | 30 parts |
| I-651 | 6 parts |
| Victoria Pure Blue | 0.04 part |
| Methyl ethyl ketone | 10 parts |

(b) Preparation of printed circuit board

On a paper-phenol laminated plate (thickness: 1.6 mm), a cellosolve acetate solution of a phenol-modified nitrile rubber type adhesive was uniformly coated by a dip coating method, air-dried and then cured by heating at 120° C. for 30 minutes and further at 170° C. for 1 hour to form an adhesive layer having a thickness of about 30 μm. Through-holes having a diameter of 1.0 mm were made at intervals of 2.54 mm by pressing. After the surface of the test substrate was polished with a Scotch-Brite (trade name) produced by Sumitomo 3M Co., Ltd., washed with water and dried at 80° C. for 10 minutes, the light-sensitive element obtained in the above (a) was laminated on the test substrate by using a laminate A-500 Model (trade name) manufactured by Akebono Sangyo Co.

Figure 3:
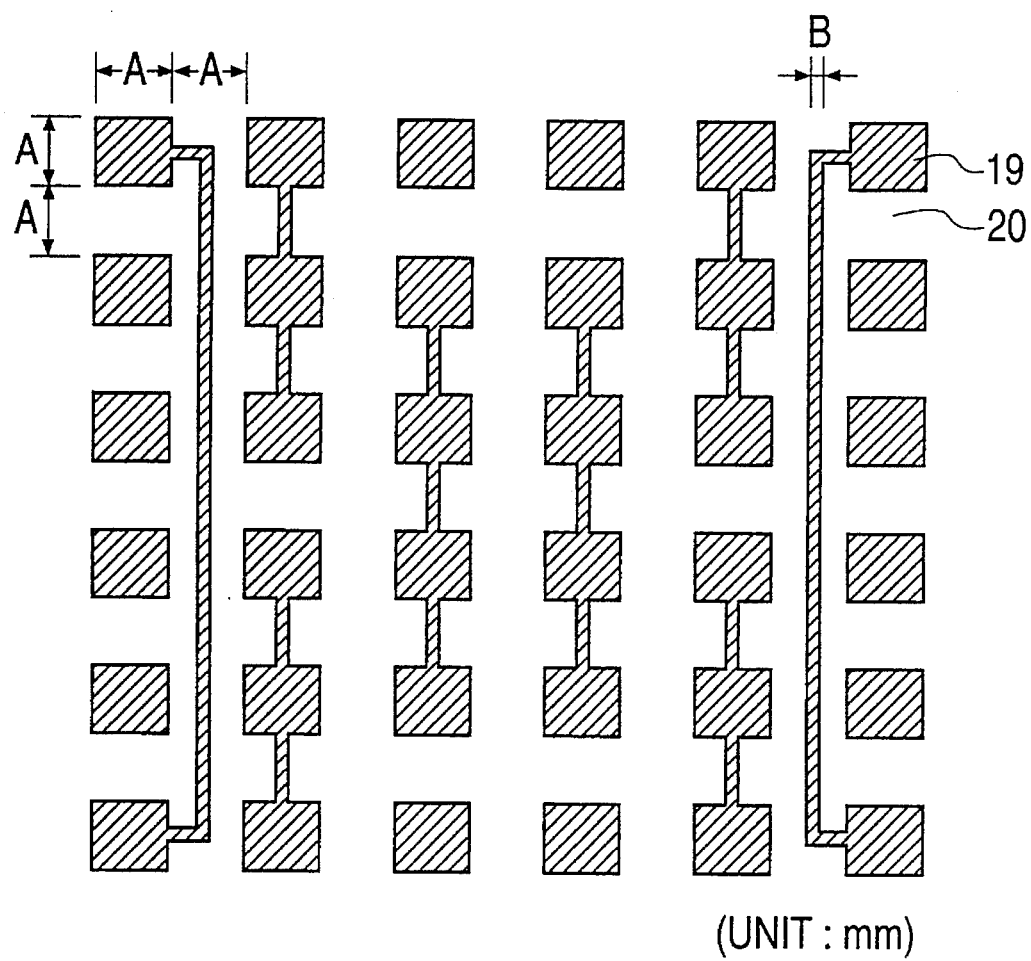
FIG. 3 is a schematic view of a negative mask for testing used in Examples described below, wherein the reference numeral 19 is a non-transparent portion of a negative mask and 20 is a transparent portion of a negative mask.

Then, a negative mask for testing shown in FIG. 3 was adhered to both surfaces of the test substrate, and exposure of 210 mJ/cm$^2$ was carried out by using an exposer HMW-590 Model (trade name) manufactured by Orc Seisakusho Co. After the test substrate was left to stand at normal temperature for 20 minutes, the support film was delaminated and then the test substrate was subjected to spray development at 40° C. for 30 seconds with a semi-aqueous developing solution prepared by using 8 g of borax (Na$_2$B$_4$O$_7$.10H$_2$O), 200 ml of diethylene glycol mono-n-butyl ether and 800 ml of water at this ratio. The test substrate was dried at 80° C. for 10 minutes to obtain a resist pattern.

Then, the test substrate was subjected to irradiation of UV rays of 3 J/cm$^2$ by using a UV ray irradiator manufactured by Toshiba Denzai Co. Thereafter, the test substrate was dipped in a roughening Solution containing 45 g/liter of chromic anhydride and 200 ml/liter of sulfuric acid at 40° C. for 10 minutes, washed with water, dipped in 5N hydrochloric acid for 2 minutes, dipped in a sensitizer HS-101B (trade name) produced by Hitachi Chemical Co., Ltd. (a diluted hydrochloric acid solution containing a palladium type plating catalyst) at normal temperature for 10 minutes, washed with water, dipped in an activating solution ADP-101 (trade name) produced by Hitachi Chemical Co., Ltd. (an alkaline aqueous solution which heightens activity of a palladium type catalyst) at normal temperature for 5 minutes and washed with water. Then, the test substrate was dipped in about 3N hydrochloric acid at normal temperature for 5 minutes, washed with water, dipped in an electroless copper plating solution containing 15 g/liter of CuSO$_4$.5H$_2$O, 30 g/liter of ethylenediaminetetraacetic acid and 10 ml/liter of a 37% HCHO aqueous solution, which was adjusted to pH 13.0 with NaOH, at 70° C. for 4 hours, washed with water and then dried at 80° C. for 10 minutes. No crack was made on the resist, and the resist was not blistered nor delaminated from the test substrate. A copper pattern (thickness: about 30 μm) having high precision was formed according to the negative mask pattern. Further, there was no gap between the resist and the copper pattern. The printed circuit board thus prepared was subjected to a soldering treatment using a flax at 260° C. for 10 seconds, and a thermal shock test of 50 cycles was conducted. No crack was made on the resist, and neither blistering nor delamination of the resist from the test substrat was observed.

Example 7

(a) Preparation of light-sensitive elements

Procedures were carried out in the same manner as in Example 1 (a) except for using solutions of light-sensitive resin compositions comprising materials shown in Table 14, respectively, to obtain Light-sensitive elements E-1 to E-6 each having a layer thickness of the light-sensitive resin composition being about 35 μm.

TABLE 14

| Material | | Amount formulated | | | | | |
|---|---|---|---|---|---|---|---|
| | | E-1 | E-2 | E-3 | E-4 | E-5 | E-6 |
| Solutions of vinyl-polymerized type high molecular binders obtained in Synthetic example 5 (50 parts as vinyl-polymerized type high molecular weight binder) | a-5 | 136 parts | — | — | — | — | — |
| | a-6 | — | 136 parts | — | — | — | — |
| | a-7 | — | — | 136 parts | — | — | — |
| | a-8 | — | — | — | 136 parts | — | — |
| | a-9 | — | — | — | — | 136 parts | — |
| | a-10 | — | — | — | — | — | 136 parts |
| BPE-10 | | 20 parts | 20 parts | 20 parts | 20 parts | 20 parts | 20 parts |
| UA-5 | | 30 parts | 30 parts | 30 parts | 30 parts | 30 parts | 30 parts |
| I-651 | | 6 parts | 6 parts | 6 parts | 6 parts | 6 parts | 6 parts |
| Victoria Pure Blue | | 0.01 part | 0.01 part | 0.01 part | 0.01 part | 0.01 part | 0.01 part |
| Methyl ethyl ketone | | 10 parts | 10 parts | 10 parts | 10 parts | 10 parts | 10 parts |

(b) Preparation of printed circuit board

In the same manner as in Example 6 (b) except for using the light-sensitive elements obtained in the above (a), electroless copper plating patterns were formed on the test substrates on which a resist image was formed, respectively.

No crack was made on the resists, and the resists was not blistered nor delaminated from the test substrates. Copper patterns each having a thickness of 30 μm were formed on the test substrates, respectively. There was no gap between the resists and the copper patterns.

The printed circuit boards thus prepared were subjected to a course of operations of dipping for 5 seconds in a silicone type oil OF-101 (trade name) produced by Toho Kagaku Kogyo Co. which was heated to 260° C. and dipping in water at room temperature for 10 seconds, repeatedly. States of blistering and delamination of the resists were observed to evaluate durability to thermal shock. The results are shown in Table 15.

TABLE 15

| Characteristic | E-1 | E-2 | E-3 | E-4 | E-5 | E-6 |
|---|---|---|---|---|---|---|
| Durability to thermal shock test | ○ | ⊙ | ⊙ | ⊙ | ⊙ | ○ |

⊙: Neither blistering nor delamination of the resist was caused at the cycle number of the thermal shock test being ≦70.
○: Neither blistering nor delamination of the resist was caused at the cycle number of the thermal shock test being ≦50 (blistering and delamination of the resist was caused at the cycle number of the thermal shock test being >50).

From the results in Table 15, it is shown that the resists of the printed circuit boards using the light-sensitive elements of the present invention have excellent durability to thermal shock.

Comparative Example 1

(a) Preparation of light-sensitive element

Procedures were carried out in the same manner as in Example 1 (a) except for using a solution of a light-sensitive resin composition comprising materials shown in Table 16 to obtain a light-sensitive element having a layer thickness of the light-sensitive resin composition being about 35 μm.

TABLE 16

| Material | Amount formulated |
|---|---|
| Solution (a-11) of vinyl-polymerized type high molecular weight binder obtained in Comparative synthetic example 1 (55 parts as vinyl polymerized type high molecular weight binder) | 149 parts |
| BPE-4 | 45 parts |
| I-651 | 6 parts |
| Victoria Pure Blue | 0.04 part |
| Methyl ethyl ketone | 10 parts |

(b) Preparation of printed circuit board

In the same manner as in Example 1 (b) except for using the light-sensitive element obtained in the above (a), an electroless copper plating pattern was formed on a test substrate on which a resist image was formed.

The surface of the resist was slightly roughened, and copper nodule was generated thereon. Further, there was a gap of about 10 μm between the resist and the plated copper.

Comparative Example 2

(a) Preparation of light-sensitive element

Procedures were carried out in the same manner as in Example 1 (a) except for using a solution of a light-sensitive resin composition comprising materials shown in Table 17 to obtain a light-sensitive element having a layer thickness of the light-sensitive resin composition being about 35 μm.

TABLE 17

| Material | Amount formulated |
|---|---|
| Solution (a-12) of vinyl-polymerized type high molecular weight binder obtained in Comparative synthetic example 2 (55 parts as vinyl polymerized type high molecular weight binder) | 149 parts |
| BPE-4 | 45 parts |
| I-651 | 6 parts |
| Victoria Pure Blue | 0.04 part |
| Methyl ethyl ketone | 10 parts |

(b) Preparation of printed circuit board

In the same manner as in Example 1 (b) except for using the light-sensitive element obtained in the above (a), an electroless copper plating pattern was formed on a test substrate on which a resist image was formed. The resist was partially blistered and delaminated from the test substrate. Further, there was a gap of about 30 μm between the resist and the plated copper pattern.

According to the process for preparing a printed circuit board of the present invention, a printed circuit board with high precision having good soldering heat resistance and thermal shock resistance can be obtained by the additive process by using a developing solution which causes less environmental pollution and can give good working environment.

Examples described above merely show embodiments of the present invention. As a matter of course, various modifications and uses can be made within the scope of the present invention.

We claim:

1. A process for preparing a printed circuit board, which comprises the steps of:

(1) forming, on a surface of an insulating substrate a layer of a light-sensitive resin composition comprising (a) 40 to 80 parts by weight of a vinyl-polymerized high molecular weight binder having an acid value of 10 to 46 mgKOH/g, (b) 20 to 60 parts by weight of a compound having at least two polymerizable unsaturated double bonds in a molecule, with the total amount of Components (a) and (b) being 100 parts by weight, and (c) a photopolymerizable initiator generating free radicals by irradiation of active light in an amount of 0.1 to 10 parts by weight based on 100 parts by weight of Components (a) and (b);

(2) forming a negative pattern in the light-sensitive resin composition on the surface of the substrate by imagewise irradiation of active light and developing with a semi-aqueous developing solution; and (3) forming a circuit pattern by electroless copper plating by using the negative pattern in the light-sensitive resin composition on the surface of the substrate as a plating resist.

2. The process according to claim 1, wherein Component (a) is a vinyl-polymerized high molecular weight binder obtained by copolymerizing a vinyl monomer having an acidic polar group with other vinyl monomer.

3. The process according to claim 2, wherein the vinyl monomer having an acidic polar group is methacrylic acid and the other vinyl monomer is a combination of methyl methacrylate and butyl methacrylate.

4. The process according to claim 2, wherein the vinyl monomer having an acidic polar group is methacrylic acid and the other vinyl monomer is a combination of methyl methacrylate and dimethylaminoethyl methacrylate.

5. The process according to claim 1, wherein Component (a) is a vinyl-polymerized high molecular weight binder containing a vinyl monomer having an amino group represented by the following formula (I):

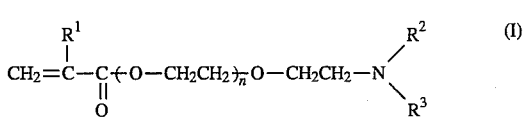

wherein $R^1$ represents a hydrogen atom or a methyl group; $R^2$ and $R^3$ each independently represent an alkyl group having 1 to 12 carbon atoms; and n representing a recurring unit number is an integer of 0 to 3, in an amount of 0.1 to 30 parts by weight based on 100 parts by weight of all copolymerizable components.

6. The process according to claim 5, wherein the vinyl monomer having an amino group represented by the formula (I) is dimethylaminoethyl acrylate or dimethylaminoethyl methacrylate.

7. The process according to claim 1, wherein Component (c) is a compound selected from the group consisting of benzophenones, a mixture thereof, anthraquinones, 2-chlorothioxanthone, benzoin isopropyl ether, benzoin ethyl ether, benzil and a 2,4,5-triarylimidazole dimer.

8. The process according to claim 1, wherein the step of forming the layer of the light-sensitive resin composition is a method of laminating a light-sensitive element using the light-sensitive resin composition.

9. The process according to claim 1, wherein the semi-aqueous developing solution comprises an alkaline substance and at least one organics solvent.

10. The process according to claim 1, which further comprises a step of exposure of active light after development.

11. The process according to claim 1, wherein Component (a) has an acid value of 20 to 40 mgKOH/g.

12. The process according to claim 1, wherein Component (a) has a weight average molecular weight of 20,000 to 200,000.

13. The process according to claim 1, wherein Component (b) is a compound selected from the group consisting of a (meth)acrylate of a polyvalent alcohol, a (meth)acrylate having a benzene ring in a molecule, an acrylic acid or methacrylic acid adduct of trimethylolpropane triglycidyl ether and a urethane acrylate compound or urethane methacrylate compound obtained by reacting trimethylhexamethylene diisocyanate with an acrylic acid monoester or methacrylic acid monoester of a divalent alcohol.

* * * * *

UNITED STATES PATENT AND TRADEMARK OFFICE
CERTIFICATE OF CORRECTION

PATENT NO.   : 5,476,690
DATED        : December 19, 1995
INVENTOR(S)  : F. OHTA, et al It is certified that error appears in the above-identified patent and that said Letters Patent is hereby corrected as shown below:

On the title page, item

"[73]  Assignee:   Hitachi Chemical Co., Ltd., Tokyo, Japan"

should read

--[73]  Assignees:  Hitachi Chemical Co., Ltd., Tokyo; Hitachi, Ltd., Tokyo, both of Japan--

Signed and Sealed this

Twenty-first Day of May, 1996

*Attest:*

BRUCE LEHMAN

*Attesting Officer*    Commissioner of Patents and Trademarks